United States Patent [19]
Nakayama

[11] Patent Number: 6,149,992
[45] Date of Patent: Nov. 21, 2000

[54] PELLICLE

[75] Inventor: Norio Nakayama, Yamaguchi-ken, Japan

[73] Assignee: Mitsui Chemicals, Inc., Tokyo, Japan

[21] Appl. No.: 09/101,828

[22] PCT Filed: Nov. 17, 1997

[86] PCT No.: PCT/JP97/04176

§ 371 Date: Oct. 19, 1998

§ 102(e) Date: Oct. 19, 1998

[87] PCT Pub. No.: WO98/22851

PCT Pub. Date: May 28, 1998

[30]     Foreign Application Priority Data

Nov. 19, 1996   [JP]   Japan ................................. 8-308380

[51] Int. Cl.[7] ................................................. G03F 9/00
[52] U.S. Cl. ................................. 428/14; 430/5
[58] Field of Search ............................. 428/14; 355/122; 430/5

[56]     References Cited

U.S. PATENT DOCUMENTS 4,996,106   2/1991   Nakagawa et al. ..................... 428/14

*Primary Examiner*—Alexander Thomas
*Attorney, Agent, or Firm*—Birch, Stewart, Kolasch & Birch, LLP

[57]     ABSTRACT

The present invention makes it possible to provide a pellicle having, on the inside of the pellicle frame, a tacky layer which exhibits excellent performance for holding foreign matters such as dust or dirt suspended in space defined by the pellicle and the mask, and resistance against light of short wavelengths such as excimer beam. The pellicle comprises a pellicle frame, a pellicle film stretched on one side of said pellicle frame, and a tacky layer formed on the inside of said pellicle frame and containing a greasy fluorine-contained resin.

19 Claims, 2 Drawing Sheets

PELLICLE

This application claims the benefit under 35 U.S.C. §371 of prior PCT International Application No. PCT/JP97/04176 which has an International filing date of Nov. 17, 1997 which designated the United States of America, the entire contents of which are hereby incorporated by reference.

TECHNICAL FIELD

The present invention relates to a pellicle and, more specifically, to a pellicle having a tacky layer with resistance against light of short wavelengths such as of excimer beam and having excellent dust-proof property.

BACKGROUND ART

In a step of photolithography, a circuit pattern is transferred, by exposure to light, onto a silicon wafer coated with a resist, by using a photomask obtained by forming a circuit pattern on the surface of a glass plate by the vacuum evaporation of chromium or the like metal or by using a reticle (hereinafter referred to as "mask"). In this step, when light is irradiated in a state where foreign matter such as dust or dirt is adhered on the circuit pattern on the mask, the foreign matter is transferred onto the wafer resulting in the formation of a wafer of defective quality. When light is projected by a stepper, in particular, it is very likely that the chips formed on the wafer become all defective. Thus, adhesion of foreign matter on the circuit pattern of the mask could turn into a serious problem. In order to solve this problem, a pellicle has been developed and various contrivances have been proposed.

In general, a pellicle is obtained by stretching a transparent film composed of nitrocellulose or the like on one side of a pellicle frame made of aluminum. Onto the other side of the pellicle frame is stuck a double-sided tape so that it can be mounted on a mask. This structure prevents the invasion of foreign matter from the outer side. Even in case foreign matter sticks on the film, it is transferred in an out-of-focus state upon irradiation with light, and a serious problem does not arise.

However, foreign matter such as dust or dirt that has once stuck to the inside of the pellicle may often fall after the pellicle is mounted. Furthermore, it often happens that the material of the surface of the pellicle frame partly collapses and falls due to vibration or the like. It is not easy to prevent the formation of dust inside the pellicle once the pellicle is mounted on the mask. In order to prevent the formation of dust from the inside of the film or the pellicle frame, therefore, it has been attempted to form a dust-preventing film by applying a tacky substance onto the inner surface of the pellicle frame (Japanese Laid-Open Patent Publication No. 8062/1989), to form a tacky substance layer on the inner surface of the pellicle film (Japanese Laid-Open Patent Publication No. 120555/1989, and to apply an organic polymer or the like onto the whole surfaces of the pellicle frame to make the surfaces smooth (Japanese Laid-Open Patent Publications Nos. 301199/1994 and 43892/1995).

Applying an organic polymer or the like onto the whole surfaces of the pellicle frame to make it smooth is advantageous from the standpoint of preventing the formation of dust from the pellicle frame but is not effective against the dust suspended in the pellicle. On the other hand, forming a tacky layer on the inside of the pellicle frame or the film is advantageous from the standpoint of preventing the formation of dust from the inside of the pellicle and holding the suspended dust so that the dust will not stick onto the mask.

However, finer masking circuit patterns have been formed year after year, and light having short wavelengths such as excimer beam has been projected. Light having short wavelengths has large energy. Therefore, an acrylic adhesive agent, rubber adhesive agent, or silicone adhesive agent that has heretofore been used as a tacky material for forming a tacky layer, is subject to be deteriorated, such as scorched, solidified or fluidized, and fails to exhibit a function for preventing the formation of dust or for holding the suspended matters to a sufficient degree.

DISCLOSURE OF THE INVENTION

The present invention was accomplished in view of the above-mentioned points, and provides a pellicle which exhibits excellent holding performance for holding foreign matters such as dust or dirt, and has, inside of the pellicle frame, a tacky layer having resistance against light of short wavelengths such as excimer beam.

In order to solve the above-mentioned problems, the present inventors have conducted keen study, have discovered the fact that a tacky layer containing a greasy fluorine-contained resin formed on the inside of the pellicle frame exhibits excellent tackiness to the dust or dirt, and makes it possible to obtain a pellicle having a tacky layer that is not deteriorated even when it is irradiated with the excimer beam, and have thus accomplished the present invention.

That is, the present invention relates to a pellicle comprising a pellicle frame, a pellicle film stretched on one side of said pellicle frame, and a tacky layer formed on the inside of said pellicle frame and containing a greasy fluorine-contained resin.

It has been known that the fluorine-contained resin, in general, exhibits excellent resistance against the heat and chemicals, exhibits no adhesiveness with many materials, and has a low coefficient of friction. The present invention, on the other hand, is based on a discovery that the greasy fluorine-contained resin exhibits tackiness exceptionally for the dust or dirt, use of the greasy fluorine-contained resin as a tacky layer on the inner surface of the pellicle makes it possible to maintain tackiness for the dust or dirt, and the tacky force is not deteriorated even upon the irradiation with light rays such as excimer beam but continues to stably hold the dust.

In the present invention, it is desired that the tacky layer exhibits holding performance which does not permit foreign matter held under a condition (1) described below to fly under at least the conditions:

(1) in which foreign matter having a particle diameter of 100 to 130 $\mu$m and a weight of 1 to 3 $\mu$g is permitted to fall on a horizontal tacky layer having a thickness of 3 $\mu$m from the height of 1 cm so as to be held by the tacky layer; and (2) wind pressure is applied for 10 seconds with an initial pressure of 0.6 kg/cm$^2$G from a straight distance of 1 cm from the foreign matter at an angle of 45 degrees from the upper side.

It is desired that the greasy fluorine-contained resin used in the present invention has a weight average molecular weight (Mw) of from 1000 to 1500 and, particularly, from 1100 to 1300 from the standpoint of maintaining tacky property for the dust and dirt. It is further desired that the greasy fluorine-contained resin is the one containing fluorine in an amount of from 12 to 80% by weight, preferably, from 28 to 75% by weight, and most preferably, from 45 to 70% by weight from the standpoint of resistance against light.

BEST MODE FOR CARRYING OUT THE INVENTION

Figure 1:
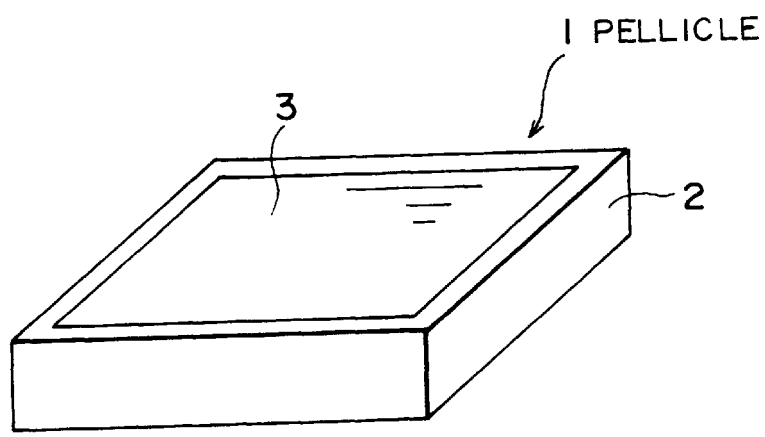
FIG. 1 is a perspective view of a pellicle of the present invention.
Figure 2:
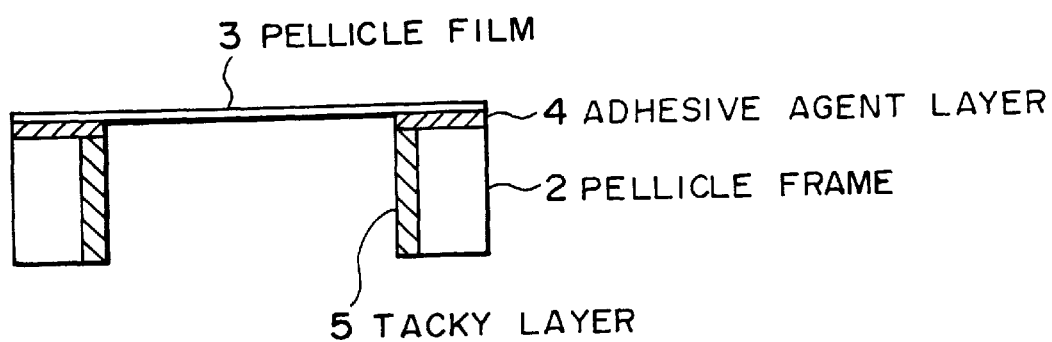
FIG. 2 is a sectional view of the pellicle of the present invention.

The invention will now be described in detail with reference to the drawings.

Pellicle of the Invention

A pellicle 1 of the invention has a pellicle frame 2, a pellicle film 3, and a tacky layer 5 having a predetermined holding force.

The pellicle frame 2 used in the invention may be the one that is usually used as a pellicle frame. The pellicle frame 2 may be made of an aluminum alloy, a stainless steel, polyethylene or aluminum treated with black Alumite. The whole surface of the pellicle frame may be further coated with an amorphous fluorine-contained polymer or the like. Among them, aluminum treated with black Alumite can be preferably used.

The thin film used in the present invention as the pellicle film 3 may be the one that is usually used as a pellicle film. For example, the thin film used as the pellicle film 3 may be composed of nitrocellulose, ethyl cellulose, cellulose acetate, cellulose propionate, pullulan compounds, amorphous fluorine-contained polymer or silicone-modified polyvinyl alcohol. Among them, the amorphous fluorine-contained polymer is preferably used having a sufficient degree of resistance against the excimer beam.

The thin film is stretched and secured by adhesion over one opening of the pellicle frame 2, i.e., over the side on which the ray of light falls, via an adhesive agent layer 4 to thereby form the pellicle film 3.

The pellicle 1 of the present invention has a tacky layer 5 containing a greasy fluorine-contained resin. Upon containing the greasy fluorine-contained resin, the tacky layer 5 exhibits resistance against light of short wavelengths such as excimer beam. The tacky layer 5 further exhibits performance for adsorbing and holding dust or dirt as will be described below. The tacky layer 5 that is provided inside of the pellicle frame 2 exhibits excellent performance for holding foreign matter such as dust or dirt suspended in space defined by the pellicle 1 and the mask, and further exhibits resistance against light of short wavelengths such as excimer beam.

Figure 3:
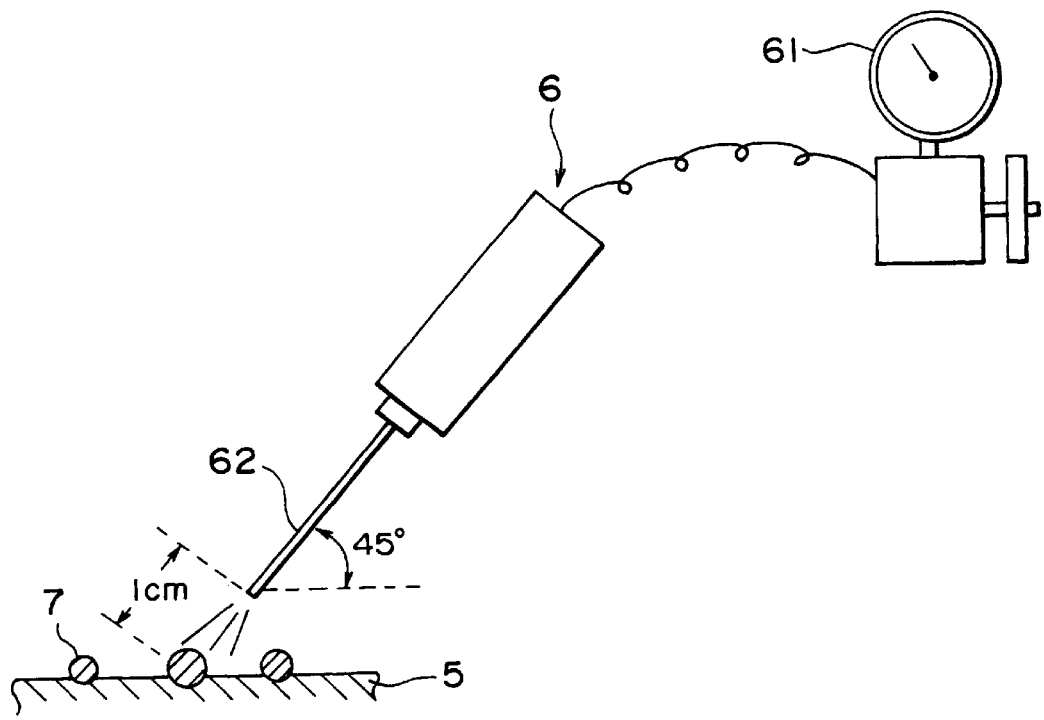
FIG. 3 is a diagram of testing the holding performance of a tacky layer of the pellicle of the present invention.

That is, the tacky layer 5 provided in the pellicle 1 of the present invention exhibits holding performance which does not permit foreign matter held under a condition (1) described below to fly under at least the conditions:

(1) in which foreign matter having a particle diameter of 100 to 130 μm and a weight of 1 to 3 μg is permitted to fall on a horizontal tacky layer having a thickness of 3 μm from the height of 1 cm so as to be held by the tacky layer; and (2) wind pressure is applied for 10 seconds with an initial pressure of 0.6 kg/cm²G from a straight distance of 1 cm from the foreign matter at an angle of 45 degrees from the upper side (see FIG. 3).

Figure 4:
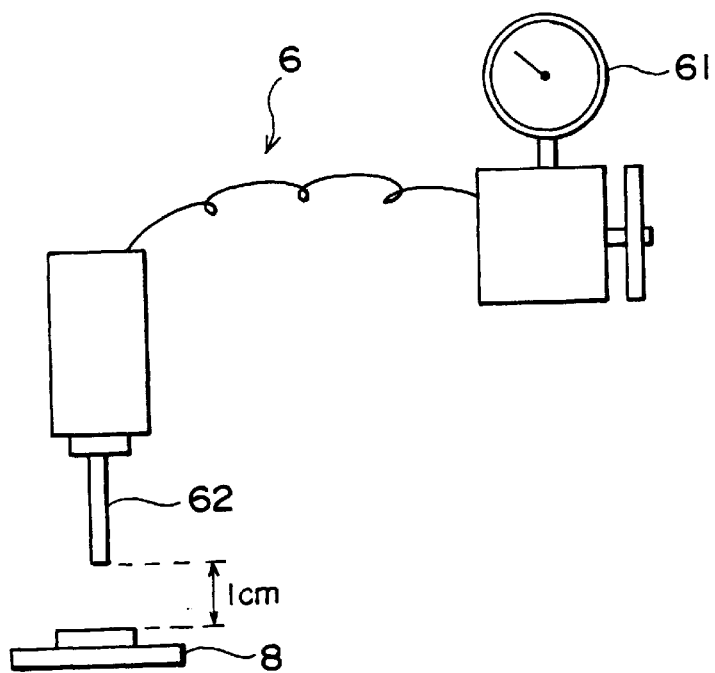
FIG. 4 is a diagram illustrating a method of measuring the wind pressure produced by an air gun used in testing the holding performance of the tacky layer.

In testing the holding performance, the wind pressure may be produced by using an air gun 6 or the like, and may be applied by placing the tip of a nozzle 62 at a straight distance of 1 cm from the foreign matter 7 at an angle of 45 degrees from the upper side with respect to the horizontal direction. As for the wind pressure under the condition (2), use is made of the air gun 6 having the nozzle 62 of an inner diameter of, for example, 0.65 mm and the air is blown onto the upper dish of a precision balance 8 from a distance of 1 cm just over the upper dish of the precision balance 8 with an initial pressure of 0.6 kg/cm²G (see FIG. 4). This pressure acting on the precision balance 8 is nearly equivalent to a weight of 1.3 g that would be displayed. Correctly, the initial pressure of 0.6 kg/cm²G stands for the air pressure of 0.6 kg/cm²G produced from the nozzle. In practice, however, the pressure of a decompression device 61 may be set to be 0.6 kg/cm²G.

Here, the words "foreign matter" are supposed to be dust or dirt that create a problem for the pellicle. In testing the holding performance, there may be used glass beads, polystyrene beads, etc. Furthermore, the words "does not permit foreign matter to fly" stand for that the foreign matter does not escape from the tacky layer. The foreign matter that migrates on the tacky layer does not mean it is flying.

The present invention has a feature in that the tacky layer 5 contains a greasy fluorine-contained resin. It is desired that the greasy fluorine-contained resin has the weight average molecular weight and contains fluorine in an amount as described above.

It is generally desired that the greasy fluorine-contained resin comprises a recurring unit represented by the following formula (1),

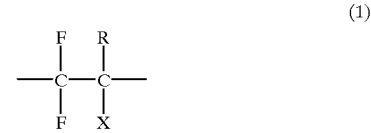

(1)

wherein X is a halogen atom such as fluorine, chlorine, bromine or iodine, and R is a fluorine atom or a trifluoromethyl group.

Its concrete examples include tetrafluoroethaylene low polymer, hexafluoropropylene low polymer, tetrafluoroethylene/hexafluoropropylene low copolymer and chlorotrifluoroethylene low polymer. Among them, a low polymer of chlorotrifluoroethylene (CTFE; weight average molecular weight of 1100 to 1300) is desired from the standpoint of maintaining tackiness to the dust or dirt and resistance against light.

The greasy fluorine-contained resin is excellent from the standpoint of maintaining tackiness and resistance against light, and can be used alone as a matter of course. When used alone, however, the greasy fluorine-contained resin tends to drip due to its fluidity.

To prevent the dust or dirt from sticking onto the mask or the like, therefore, it is desired that the greasy fluorine-contained resin which forms the tacky layer is used in the form of a composition together with other polymer which can suppresses the fluidity of the tacky layer. The other polymer used for suppressing the fluidity will be a thermoplastic resin or a thermosetting resin having a molecular weight high enough for forming a film.

Examples of the thermoplastic resin include fluorine-contained resin, olefin resin, styrene resin, acrylic resin, chlorine-contained resin, polyamide, thermoplastic polyester, polycarbonate, polyphenylene oxide, polyimide, polyamideimide, polysulfone, thermoplastic polyurethane, or a mixture of two or more kinds thereof.

On the other hand, examples of the thermosetting resin include phenol-formaldehyde resin, furane-formaldehyde resin, xylene-formaldehyde resin, ketone-formaldehyde resin, urea formaldehyde resin, melamine-formaldehyde resin, alkyd resin, unsaturated polyester resin, epoxy resin, bismaleimide resin, triaryl cyanurate resin, thermosetting acrylic resin, silicone resin, urethane resin, or a mixture of two or more kinds thereof.

In this embodiment, it is desired that the greasy fluorine-contained resin is contained in a tacky composition in an amount of from 90 to 98.7% by weight and, particularly, from 95 to 98% by weight.

In the tacky layer of the above-mentioned composition, it is believed that the high-molecular polymer exists as a film, mesh or cells under the surface of the pellicle, and that this system holds the greasy fluorine-contained resin to prevent it from being fluidized.

It is desired that the high-molecular resin can be compatible with the greasy fluorine-contained resin and exhibits excellent resistance against light. From this point of view, it is desired to use a fluorine-conzained resin having a molecular weight large enough for forming a film.

That is, according to a preferred embodiment of the present invention, the tacky layer is a composition comprising (A) a greasy fluorine-contained resin and (B) a fluorine-contained resin having a molecular weight (high molecular weight) capable of forming a film. In this case, it is desired that the tacky layer is a composition containing (A) the greasy fluorine-contained resin and (B) the high-molecular fluorine-contained resin at a weight ratio (A):(B) of from 11:1 to 80:1, particularly, from 20:1 to 65:1 and, most particularly, from 20:1 to 50:1, from the standpoint of maintaining tackiness to the dust, resistance against light, and preventing the tacky film from dripping.

It is desired that the high molecular fluorine-contained resin (B) is the one containing fluorine in an amount of from 12 to 80% by weight, particularly, from 28 to 75% by weight and, most particularly, from 45 to 70% by weight, from the standpoint of resistance against light. It is further desired that the high-molecular fluorine-contained resin (B) has a molecular weight high enough for forming a film and, generally, has a molecular weight, in terms of a weight average molecular weight, of not smaller than $1 \times 10^4$ and, particularly, from $1 \times 10^5$ to $1 \times 10^6$.

It is further desired that the high-molecular fluorine-contained resin (B) prevents the tacky layer from dripping during the use, during the storage or during the transit despite of an increase in the temperature, and, usually, has a softening point of not lower than 50° C., particularly, not lower than 60° C. and, most particularly, not lower than 75° C. It is further desired that the high molecular fluorine-contained resin (B) is soluble in a solvent which is commonly used for the greasy fluorine-contained resin (A) at the time of being applied to the pellicle.

From the standpoint of film-forming property and adhesiveness to the pellicle frame, it is desired that the high-molecular fluorine-contained resin (B) is at least the one selected from the group consisting of a perfluorobutenylvinyl ether polymer, a copolymer of a tetrafluoroethylene and a perfluoro(2,2-dimethyl-1,3-dioxole), a copolymer of a tetrafluoroethylene, a hexafluoropropylene and a vinylidene fluoride, a copolymer of a hexafluoropropylene and a vinylidene fluoride, and a copolymer of a chlorotrifluoroethylene and a vinylidene fluoride. Among these fluorine-contained resins, a copolymer (THV) of tetrafluoroethylene, hexafluoropropylene and vinylidene fluoride, is particularly desired. These fluorine-contained resins may be modified with a carboxyl group.

It is desired that the tacky layer used in the present invention exhibits tackiness usually over a temperature range of from −10° C. to 50° C. The tackiness can be confirmed by the above-mentioned testing method. This quite holds for the tackiness after irradiated with light.

According to the present invention, the tacky layer may be formed in a thickness capable of holding dust or dirt, and there is no particular limitation in the thickness thereof. Usually, however, it is desired that the thickness is from 1 $\mu$m to 1 mm, particularly, from 3 $\mu$m to 100 $\mu$m and, most particularly, from 3 $\mu$m to 20 $\mu$m.

Preparation of Pellicle of the Invention

The pellicle 1 according to the present invention is prepared by forming the tacky layer 5 on the inside of the pellicle frame 2, and stretching the pellicle film on one side of the pellicle frame 2 on which the ray of light falls.

To form the tacky layer 5, first, a coating solution is prepared containing a greasy fluorine-contained resin or further a polymer for suppressing the fluidity. The coating solution is obtained by dissolving the greasy fluorine-contained resin or further the polymer for suppressing the fluidity in a solvent capable of dissolving the greasy fluorine-contained resin.

The concentration of solid components in the coating solution varies depending upon the composition of resins or the manner of coating, but is, usually, from 10 to 80% by weight and, particularly, from 30 to 70% by weight.

The coating solution is obtained by, for example, adding a chlorotrifluoroethylene low polymer as a greasy fluorine-contained resin to a solvent of the type of ketone or ester such as ethyl acetate, isopropyl acetate or methyl ethyl ketone, followed by stirring. When the chlorotrifluoroethylene is used as the greasy fluorine-contained resin, furthermore, it is further desired to mix a fluorine-contained resin for suppressing the fluidity. A copolymer of tetrafluoroethylene, hexafluoropropylene and vinylidene fluoride, or a copolymer of hexafluoropropylene and vinylidene fluoride is added and is dissolved thereby to obtain a coating solution. As required, furthermore, the coating solution may be filtered under an elevated pressure.

The obtained coating solution can be applied to the inside of the pellicle frame by any known coating means, such as spray coating method, dipping coating method, brush coating method, knife coating method, roller coating method or spread coating method. In the case of the spread coating method, for example, liquid droplets placed on the frame are spread by using a jig so as to be uniformly applied thereon. Finally, the coating solution applied onto the frame is dried to form a tacky layer.

After the tacky layer 5 is formed, a thin pellicle film is stretched on one side of the pellicle frame 2 on which the ray of light falls, thereby to obtain the pellicle 1 of the present invention. The thin pellicle film is stretched by a customary manner and is secured by forming an adhesive agent layer 4 using an adhesive agent that is usually used.

The adhesive agent will be the known one, such as cellulose derivative, chlorinated polypropylene, polyamide adhesive agent, fluorine-contained resin adhesive agent, acrylic adhesive agent, epoxy resin, or polyimide adhesive agent.

EXAMPLES

The present invention will now be described by way of the following Examples to which only, however, the invention is in no way limited.

Example 1

A solution was prepared by dissolving a chlorotrifluoroethylene low polymer (trade name: Daifloyl #100 produced by Daikin Kogyo Co., hereinafter simply referred to as CTFE) having a weight average molecular weight of 1100 to 1300 in ethyl acetate such that its amount was 40% by weight.

A tetrafluoroethylene/hexafluoropropylene/vinylidene fluoride copolymer (Fluoroplastic THV 200 produced by Sumitomo 3M Co., hereinafter simply referred to as THV 200) was added to the above solution such that the weight ratio of CTFE:THV 200 was 30:1, followed by sufficient degree of stirring. The weight average molecular weight of this THV 200 resin measured by GPC was $1.7 \times 10^5$. By using a filter (porous diameter of 1.0 $\mu$m) of polytetrafluoroethylene (PTFE), the solution was filtered under an elevated pressure to obtain a coating solution.

The coating solution was dripped on the surface in the inside of the washed pellicle frame 2, and the droplets on the frame was stretched using a jig to uniformly apply it thereon. The coating was dried upon being left to stand at room temperature for one hour to thereby form the tacky layer 5.

Testing the Holding Performance

Glass beads 7 having a diameter of 105 $\mu$m weighing 1.5 $\mu$g were permitted to fall on the tacky layer 5 of the pellicle frame 2 from a height of 1 cm, so that about five to ten of them were held on the tacky layer 5. By using an air gun 6, the air was blown onto the glass beads 7 with a pressure of 0.6 kg/cm$^2$ from a distance of 1 cm at an angle of 45 degrees from the upper side (FIG. 3). However, no glass bead 7 flew from the tacky layer 5.

Testing the Resistance against Light

The tacky layer 5 was irradiated with light from a KrF excimer laser (248 nm) in a total of 2000 J/cm$^2$ under a condition of 5 mJ/cm$^2$·p×100 Hz in order to test the holding performance (FIG. 3) after irradiation in the same manner as the above-mentioned testing of holding performance. No glass bead flew from the tacky layer.

The state of the irradiated portion was observed through a microscope, but no change was recognized in the surface state of the tacky layer.

The obtained results were as shown in Table 1.

Examples 2 to 4 and Comparative Examples 1 to 3

Coating solutions were prepared by blending ethyl acetate with the Daifloyl and THV 200 at mixing ratios of CTFE:THV 200 of 100:0, 100:1, 60:1, 40:1, 20:1 and 10:1. These coating solutions were applied to the pellicle frames 2 to form tacky layers 5 having holding performances as shown in Table 1.

Glass beads 7 having a diameter of 105 $\mu$m weighing 1.5 $\mu$g were allowed to fall on the tacky layers 5 of the pellicle frames 2 from a height of 1 cm, so that five to ten of them were held on the tacky layers. By using the air gun 6, the air was blown onto the glass beads 7 with a pressure of 0.6 kg/cm$^2$ from a distance of 1 cm at an angle of 45 degrees from the upper side (FIG. 3) to examine the motion of the glass beads 7.

Furthermore, the pellicle frames 2 forming the tacky layers 5 were so held that the surfaces of the tacky layers were at right angles with the horizontal plane, left to stand at a temperature of 50° C. for 24 hours, and the surfaces of the tacky layers 5 were observed to make sure if the surfaces were dripping or not.

The results were as shown in Table 1.

TABLE 1

Holding performance and preservability of the tacky layers.

| | CTFE low polymer: THV 200 resin | Motion of glass beads** (holding performance) | Surface state at 50° C. after 24 hrs*** (preservability) |
|---|---|---|---|
| Comp. Ex. 1 | 100:0 (0%*) | migrates and flies | drips |
| Comp. Ex. 2 | 100:1 (1.0%*) | migrates and flies | drips |
| Ex. 2 | 60:1 (1.6%*) | migrates | drips a little |
| Ex. 3 | 40:1 (2.4%*) | migrates | does not drip |
| Ex. 4 | 20:1 (4.8%:) | migrates | does not drip |
| Comp. Ex. 3 | 10:1 (9.1%*) | migrates and flies | does not drip |

*Amount of THV 200 resin (% by weight) in the composition.
**"Migrates and flies" means that the glass beads partly flew and partly migrated on the tacky layer. "Migrates" means that the glass beads did not fly from the tacky layer but migrated on the tacky layer.
***"Drips" means that the tacky layer dripped and the surface of the frame was exposed. "Drips a little" means that the tacky layer dripped but the surface of the frame was not exposed.

The present invention makes it possible to provide a pellicle having, on the inside of the pellicle frame, a tacky layer which exhibits excellent performance for holding foreign matters such as dust or dirt suspended in space defined by the pellicle and the mask, and resistance against light of short wavelengths such as excimer beam.

What is claimed is:

1. A pellicle comprising:

a pellicle frame, a pellicle film stretched on one side of said pellicle frame, and a tacky layer formed on the inside of said pellicle frame and containing a greasy fluorine-contained resin wherein said greasy fluorine-contained resin has a weight average molecular weight of from 1000 to 1500.

2. A pellicle according to claim 1, wherein said tacky layer exhibits holding performance which does not permit foreign matter held under a condition (1) described below to fly under at least the conditions:

(1) in which foreign matter having a particle diameter of 100 to 130 $\mu$m and a weight of 1 to 3 $\mu$g is permitted to fall on a horizontal tacky layer having a thickness of 3 $\mu$m from the height of 1 cm so as to be held by the tacky layer; and (2) wind pressure is applied for 10 seconds with an initial pressure of 0.6 kg/cm$^2$G from a straight distance of 1 cm from the foreign matter at an angle of 45 degrees from the upper side.

3. A pellicle according to claim 1, wherein said greasy fluorine-contained resin is the one containing fluorine in an amount of from 12 to 80% by weight.

4. A pellicle according to claim 3, wherein said greasy fluorine-contained resin comprises a recurring unit represented by the following formula (1),

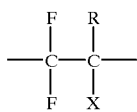

(1)

wherein X is a halogen atom, and R is a fluorine atom or a trifluoromethyl group.

5. A pellicle according to claim 1, wherein said greasy fluorine-contained resin is a low polymer of chlorotrifluoroethylene.

6. A pellicle according to claim 1, wherein said tacky layer comprises a composition of a greasy fluorine-contained resin and a polymer for suppressing the fluidity, and said greasy fluorine-contained resin is contained in the composition in an amount of from 90 to 98.7% by weight.

7. A pellicle according to claim 1, wherein said tacky layer comprises a composition of (A) a greasy fluorine-contained resin, and (B) a fluorine-contained resin capable of forming a film.

8. A pellicle according to claim 7, wherein said adhesive layer comprises a composition containing (A) a greasy fluorine-contained resin and (B) a fluorine-contained resin capable of forming a film at a weight ratio (A):(B) of from 20:1 to 50:1.

9. A pellicle according to claim 7, wherein the fluorine-contained resin (B) capable of forming a film contains fluorine in an amount of from 12 to 80% by weight.

10. A pellicle according to claim 7, wherein the fluorine-contained resin (B) capable of forming a film is at least the one selected from the group consisting of a perfluorobutenylvinyl ether polymer, a copolymer of a tetrafluoroethylene and a perfluoro(2,2-dimethyl-1,3-dioxole), a copolymer of a tetrafluoroethylene, a hexafluoropropylene and a vinylidene fluoride, a copolymer of a hexafluoropropylene and a vinylidene fluoride, and a copolymer of a chlorotrifluoroethylene and a vinylidene fluoride.

11. A pellicle according to claim 7, wherein said adhesive layer comprises a composition containing (A) a greasy fluorine-contained resin and (B) a fluorine-contained resin capable of forming a film at a weight ratio of (A):(B) of from 11:1 to 80:1.

12. A pellicle according to claim 7, wherein the fluorine-contained resin (B) capable of forming a film contains fluorine in an amount of from 28 to 75% by weight.

13. A pellicle according to claim 7, wherein the fluorine-contained resin (B) has a molecular weight, in terms of weight average molecular weight, of greater than or equal to $1 \times 10^4$.

14. A pellicle according to claim 7, wherein the fluorine-contained resin (B) has a softening point of greater than or equal to 50° C.

15. A pellicle according to claim 1, wherein said tacky layer is formed maintaining a thickness of from 3 to 20 μm.

16. A pellicle according to claim 1 wherein said greasy fluorine-contained resin has a weight average molecular weight of from 1100 to 1300.

17. A pellicle according to claim 1 wherein said greasy fluorine-contained resin is one containing fluorine in an amount of from 28 to 75% by weight.

18. A pellicle according to claim 1, wherein said tacky layer comprises a composition of greasy fluorine-contained resin and a polymer for suppressing the fluidity, and said greasy fluorine-contained resin is contained in the composition in an amount of from 95 to 98% by weight.

19. A pellicle according to claim 1, wherein the tacky layer exhibits tackiness over a temperature rage of from −10° to 50° C.

* * * * *